United States Patent
Eguchi et al.

(10) Patent No.: US 8,753,793 B2
(45) Date of Patent: Jun. 17, 2014

(54) METHOD FOR PRODUCING RESIN SOLUTION FOR PHOTORESIST, PHOTORESIST COMPOSITION, AND PATTERN-FORMING METHOD

(75) Inventors: Akira Eguchi, Himeji (JP); Masamichi Nishimura, Himeji (JP)

(73) Assignee: Daicel Chemical Industries, Ltd., Osaka (JP)

( * ) Notice: Subject to any disclaimer, the term of this patent is extended or adjusted under 35 U.S.C. 154(b) by 225 days.

(21) Appl. No.: 13/132,375

(22) PCT Filed: Jan. 15, 2009

(86) PCT No.: PCT/JP2009/000126
§ 371 (c)(1),
(2), (4) Date: Jun. 2, 2011

(87) PCT Pub. No.: WO2010/082232
PCT Pub. Date: Jul. 22, 2010

(65) Prior Publication Data
US 2011/0244394 A1    Oct. 6, 2011

(51) Int. Cl.
*G03F 7/004* (2006.01)
*G03F 7/039* (2006.01)
*C08F 20/10* (2006.01)

(52) U.S. Cl.
USPC ........................................ 430/270.1; 526/318

(58) Field of Classification Search
USPC ................ 430/270.1, 326, 910, 327; 526/318
See application file for complete search history.

(56) References Cited

U.S. PATENT DOCUMENTS

| | | | |
|---|---|---|---|
| 6,537,718 B2 | 3/2003 | Nishiyama et al. | |
| 6,537,726 B2 * | 3/2003 | Nakanishi et al. | 430/270.1 |
| 6,664,023 B2 * | 12/2003 | MacDowell et al. | 430/270.1 |
| 6,743,562 B2 * | 6/2004 | Momota et al. | 430/170 |
| 7,838,606 B2 | 11/2010 | Yamagishi et al. | |
| 2005/0096447 A1 | 5/2005 | Yamagishi et al. | |
| 2006/0073411 A1 | 4/2006 | Yamamoto et al. | |
| 2007/0026343 A1 | 2/2007 | Tarutani | |

FOREIGN PATENT DOCUMENTS

| | | |
|---|---|---|
| EP | 1 053 510 B1 | 1/2003 |
| JP | 6-256565 A | 9/1994 |
| JP | 7-74073 A | 3/1995 |
| JP | 9-152714 A | 6/1997 |
| JP | 2000-231200 A | 8/2000 |
| JP | 2001-125269 A | 5/2001 |
| JP | 2001-183837 A | 7/2001 |
| JP | 2002-502055 A | 1/2002 |
| JP | 2002-201210 A | 7/2002 |
| JP | 2002-268235 A | 9/2002 |
| JP | 2004-199019 A | 7/2004 |
| JP | 2005-132974 A | 5/2005 |
| JP | 2007-34049 A | 2/2007 |
| JP | 2007-154061 A | 6/2007 |
| JP | 2006-126818 A | 5/2008 |
| JP | 2009-37108 A | 2/2009 |

OTHER PUBLICATIONS

Machine translation of JP 2002-201210, published on Jul. 19, 2002.*
International Search Report dated Mar. 17, 2009 in International Application No. PCT/JP2009/000126.

* cited by examiner

*Primary Examiner* — Anca Eoff
(74) *Attorney, Agent, or Firm* — Birch, Stewart, Kolash & Birch, LLP

(57) ABSTRACT

Disclosed is a method for producing a resin solution for photoresists, which includes the steps of heating and thereby aging a solution at 30° C. to 90° C. for 30 minutes or longer, the solution containing, in a solvent, a photoresist resin capable of being alkali-soluble by the action of an acid; and filtering the aged solution through a filter medium having a pore size of 1 μm or less. The method gives a photoresist composition having good filterability which enables uniform patterning. The method also gives a resin solution for photoresists which is stable over a long time, namely, a resin solution for photoresists which maintains good filterability even after long-term storage.

6 Claims, No Drawings

METHOD FOR PRODUCING RESIN SOLUTION FOR PHOTORESIST, PHOTORESIST COMPOSITION, AND PATTERN-FORMING METHOD

TECHNICAL FIELD

The present invention relates to a method for producing a resin solution for photoresists, a photoresist composition, and a pattern-forming method (patterning method).

BACKGROUND ART

Recent dramatic innovation on lithographic patterning techniques in the manufacture of semiconductor devices has made lithographic line widths finer and finer. In lithographic exposure, i line and g line were initially used, but they gave patterns with broad line widths, and the manufactured semiconductor devices thereby had low capacities. However, recent technological developments have allowed the use of KrF excimer laser to give patterns with dramatically finer line widths. Thereafter the technological developments have continued so as to adopt ArF excimer laser having a further shorter wavelength to lithographic exposure, and this has been achieved in very recent years. Customary resins, i.e., novolak or styrenic resins, have been used in exposure to KrF excimer laser beams. However, for exposure to ArF excimer laser beams, the novolak or styrenic resins have been replaced with resins containing no aromatic moieties, i.e., replaced with alicyclic resins, because the ArF excimer laser beams have a further shorter wavelength of 193 nm, and resins containing aromatic moieties, such as the novolak or styrenic resins, absorb the light of this wavelength. Such resins for photoresists require the property of being alkali-soluble as a result of the leaving of a moiety thereof with an acid and require uniform adhesion to the substrate. For satisfying these requirements, various polar groups are introduced into alicyclic resins. The resulting resins, however, tend to be slightly soluble in organic solvents for photoresists, probably because of their complicated structures.

Solutions as photoresist compositions should be subjected to fine or microscopic filtration before used in semiconductor manufacture, but most of them show poor filtration performance (filterability). To solve this problem, some techniques have been proposed as in Patent Literature (PTL) 1 and PTL 2. However, the lithographic techniques using ArF excimer laser are experiencing further evolution and currently employ immersion lithographic techniques which proceed and enable further finer patterning. This requires further improvements in filtration performance of resin solutions for photoresists.
PTL 1: Japanese Unexamined Patent Application Publication (JP-A) No. 2001-183837
PTL 2: Japanese Unexamined Patent Application Publication (JP-A) No. 2000-231200

DISCLOSURE OF INVENTION

Technical Problem

An object of the present invention is to provide a resin solution for photoresists which is stable over a long time, namely, a resin solution for photoresists which is resistant to deterioration in filtration performance even after stored over a prolonged period, and to thereby provide a photoresist composition which has satisfactory filterability and enables uniform patterning.

Solution to Problem

After intensive investigations to achieve the objects, the present inventors have found that a solution of a synthesized resin may have dramatically improved filterability by treating the resin solution under specific conditions. The present invention has been made based on these findings.

Specifically, the present invention provides, in an aspect, a method for producing a resin solution for photoresists, the method including the steps of heating and thereby aging a solution at 30° C. to 90° C. for 30 minutes or longer, the solution containing, in a solvent, a photoresist resin capable of being alkali-soluble by the action of an acid; and filtering the aged solution through a filter medium having a pore size of 1 μm or less.

In an embodiment of the method for producing a resin solution for photoresists, the photoresist resin capable of being alkali-soluble by the action of an acid includes, as polymer units, at least a unit represented by following Formula (1):

[Chem. 1]

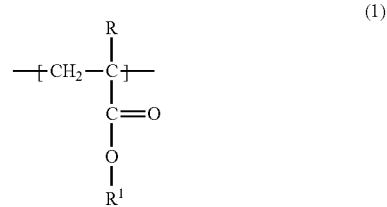

wherein R represents a hydrogen, atom, a halogen atom, or an alkyl or haloalkyl group having 1 to 6 carbon atoms; and $R^1$ represents a protecting group capable of leaving with an acid.

In another embodiment of the method for producing a resin solution for photoresists, the photoresist resin capable of being alkali-soluble by the action of an acid comprises, as polymer units, at least a unit represented by following Formula (2):

[Chem. 2]

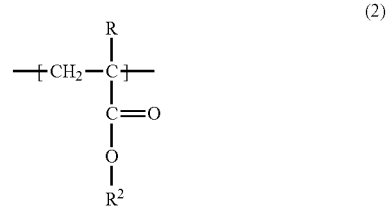

wherein R represents a hydrogen atom, a halogen atom, or an alkyl or haloalkyl group having 1 to 6 carbon atoms; and $R^2$ represents a group containing a lactone skeleton and having 4 to 20 carbon atoms.

In yet another embodiment of the method for producing a resin solution for photoresists, the photoresist resin capable of being alkali-soluble by the action of an acid comprises, as polymer units, at least a unit represented by following Formula (3):

[Chem. 3]

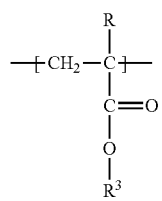
(3)

wherein R represents a hydrogen atom, a halogen atom, or an alkyl or haloalkyl group having 1 to 6 carbon atoms; and $R^3$ represents a group including a polar-group-containing alicyclic skeleton and having 4 to 20 carbon atoms.

In still another embodiment, the method for producing a resin solution for photoresists further includes the steps of carrying out a polymerization reaction to give a polymerization solution containing the photoresist resin; adding the polymerization solution to a poor solvent with respect to the photoresist resin to form precipitates; collecting the precipitates through filtration; dissolving the collected precipitates in an organic solvent to give a solution; and distilling off the poor solvent from the solution, before the step of heating and thereby aging the solution at 30° C. to 90° C. for 30 minutes or longer, the solution containing the photoresist resin capable of being alkali-soluble by the action of an acid.

In another embodiment of the method for producing a resin solution for photoresists, the solvent used in the solution containing the photoresist resin capable of being alkali-soluble by the action of an acid includes at least propylene glycol monomethyl ether acetate (PGMEA) and/or propylene glycol monomethyl ether (PGME).

In the method for producing a resin solution for photoresists in yet another embodiment, in the step of heating and thereby aging the solution at 30° C. to 90° C. for 30 minutes or longer, the solution containing the photoresist resin capable of being alkali-soluble by the action of an acid has a solids concentration of 3 to 40 percent by weight.

The present invention also provides, in another aspect, a resin solution for photoresists, obtained by heating and thereby aging a solution at 30° C. to 90° C. for 30 minutes or longer, the solution containing, in a solvent, a photoresist resin capable of being alkali-soluble by the action of an acid; and filtering the aged solution through a filter medium having a pore size of 1 µm or less.

The present invention further provides, in still another aspect, a photoresist composition including the resin solution for photoresists; and a light-activatable acid generator, the resin solution for photoresists being obtained by heating and thereby aging a solution at 30° C. to 90° C. for 30 minutes or longer, the solution containing, in a solvent, a photoresist resin capable of being alkali-soluble by the action of an acid; and filtering the aged solution through a filter medium having a pore size of 1 µm or less.

In addition, the present invention provides, in yet another aspect, a pattern-forming method including at least the steps of applying the photoresist composition to a substrate to give a film; exposing the film; and dissolving exposed portions of the film in an alkali to form a pattern.

Advantageous Effects of Invention

The present invention provides a resin solution for photoresists having good filtration performance, whereby provides a satisfactory photoresist composition, and significantly avoids troubles in filtration in semiconductor manufacturing processes.

BEST MODES FOR CARRYING OUT THE INVENTION

The photoresist resin in the present invention is often used in positively working photoresists and typically includes, in polymer units constituting the resin, a group capable of being alkali-soluble by the action of an acid. As used herein the terms "acryl(ic)" and "methacryl(ic)" are also generically referred to as "(meth)acryl(ic)".

Such groups capable of being alkali-soluble by the action of an acid each often include an acidic moiety having solubility in an alkali, such as phenol or carboxylic acid moiety, which acidic moiety is protected.

Of polymer units (polymerization units) constituting the resin capable of being alkali-soluble by the action of an acid, polymer units represented by Formula (1) are units each having a group capable of being alkali-soluble by the action of an acid. Exemplary monomers corresponding to the polymer units represented by Formula (1) are as follows.

[Chem. 4]

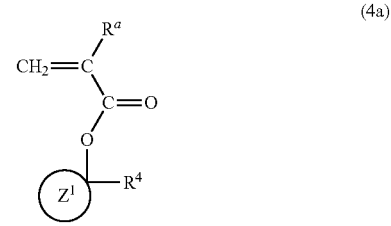
(4a)

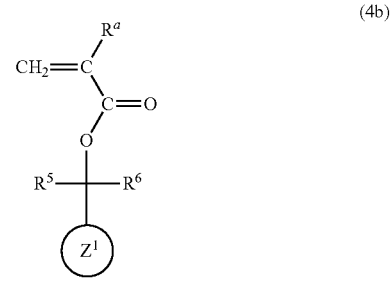
(4b)

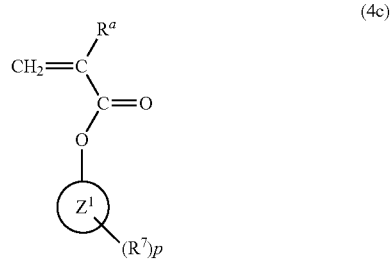
(4c)

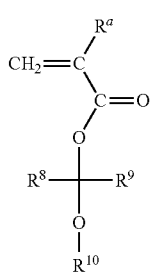

(4d)

In Formulae (4a), (4b), and (4c), Ring $Z^1$ represents a substituted or unsubstituted alicyclic hydrocarbon ring having 6 to 20 carbon atoms; $R^a$ represents a hydrogen atom, a halogen atom, or an alkyl or haloalkyl group having 1 to 6 carbon atoms; $R^4$, $R^5$, and $R^6$ are the same as or different from one another and each represent a substituted or unsubstituted alkyl group having 1 to 6 carbon atoms; $R^7$s are substituents bound to Ring $Z^1$, are the same as or different from each other, and each represent an oxo group, an alkyl group, a protected or unprotected hydroxyl group, a protected or unprotected hydroxyalkyl group, or a protected or unprotected carboxyl group, wherein at least one of p$R^7$s represents a —COOR$^c$ group, where $R^c$ represents a substituted or unsubstituted tertiary hydrocarbon group, a tetrahydrofuranyl group, a tetrahydropyranyl group, or an oxepanyl group; "p" denotes an integer of 1 to 3; $R^8$ and $R^9$ are the same as or different from each other and each represent a hydrogen atom or a substituted or unsubstituted alkyl group having 1 to 6 carbon atoms; and $R^{10}$ represents a hydrogen atom or an organic group, wherein at least two of $R^8$, $R^9$, and $R^{10}$ may be bound to each other to form a ring with an adjacent atom or atoms.

In Formulae (4a), (4b), and (4c), the alicyclic hydrocarbon ring having 6 to 20 carbon atoms as Ring $Z^1$ may be a monocyclic ring or a polycyclic ring such as fused ring or bridged ring. Typical examples of the alicyclic hydrocarbon ring include cyclohexane ring, cyclooctane ring, cyclodecane ring, adamantane ring, norbornane ring, norbornene ring, bornane ring, isobornane ring, perhydroindene ring, decalin ring, perhydrofluorene ring (tricyclo[7.4.0.0$^{3,8}$]tridecane ring), perhydroanthracene ring, tricyclo[5.2.1.0$^{2,6}$]decane ring, tricyclo[4.2.2.1$^{2,5}$]undecane ring, and tetracyclo [4.4.0.1$^{2,5}$.1$^{7,10}$]dodecane ring. The alicyclic hydrocarbon ring may have one or more substituents. Exemplary substituents herein include alkyl groups (e.g., alkyl groups each having 1 to 4 carbon atoms) such as methyl group; halogen atoms such as chlorine atoms; protected or unprotected hydroxyl groups; oxo groups; and protected or unprotected carboxyl groups. Ring $Z^1$ is preferably a polycyclic alicyclic hydrocarbon ring (bridged hydrocarbon ring) such as adamantane ring.

Exemplary halogen atoms as $R^a$ [and as R in Formulae (1), (2), and (3)] include fluorine atoms and chlorine atoms. Exemplary alkyl groups each having 1 to 6 carbon atoms as $R^a$ (and as R) include methyl, ethyl, propyl, isopropyl, butyl, pentyl, and hexyl groups. $R^a$ (and R) is preferably a hydrogen atom, a fluorine atom, or an alkyl or fluoroalkyl group having 1 to 4 carbon atoms.

In Formulae (4a), (4b), and (4d), exemplary substituted or unsubstituted alkyl groups each having 1 to 6 carbon atoms as $R^4$, $R^5$, $R^6$, $R^8$, and $R^9$ include linear or branched chain alkyl groups each having 1 to 6 carbon atoms, such as methyl, ethyl, propyl, isopropyl, butyl, isobutyl, s-butyl, t-butyl, and hexyl groups; and haloalkyl groups each having 1 to 6 carbon atoms, such as trifluoromethyl group. In Formula (4c), exemplary alkyl groups as $R^7$ include linear or branched chain alkyl groups each having 1 to about 20 carbon atoms, such as methyl, ethyl, propyl, isopropyl, butyl, isobutyl, s-butyl, t-butyl, hexyl, octyl, decyl, and dodecyl groups. Exemplary protected or unprotected hydroxyl groups as $R^7$ include hydroxyl groups and substituted oxy groups (e.g., alkoxy groups each having 1 to 4 carbon atoms, such as methoxy, ethoxy, and propoxy groups). Exemplary protected or unprotected hydroxyalkyl groups include groups each corresponding to an alkylene group having 1 to 6 carbon atoms and being bound to the protected or unprotected hydroxyl group. Exemplary protected or unprotected carboxyl groups include a —COOR$^d$ group. In this group, $R^a$ represents a hydrogen atom or an alkyl group, where examples of the alkyl group include linear or branched chain alkyl groups each having 1 to 6 carbon atoms, such as methyl, ethyl, propyl, isopropyl, butyl, isobutyl, s-butyl, t-butyl, and hexyl groups. In $R^7$, exemplary tertiary hydrocarbon groups as $R^c$ of the —COOR$^c$ group include t-butyl, t-amyl, 2-methyl-2-adamantyl, and (1-methyl-1-adamantyl)ethyl groups. Exemplary tetrahydrofuranyl groups include 2-tetrahydrofuranyl group; exemplary tetrahydropyranyl groups include 2-tetrahydropyranyl group; and exemplary oxepanyl groups include 2-oxepanyl group.

Exemplary organic groups as $R^{10}$ include groups each having a hydrocarbon group and/or heterocyclic group. Exemplary hydrocarbon groups include aliphatic hydrocarbon groups, alicyclic hydrocarbon groups, aromatic hydrocarbon groups; and groups each including two or more of these groups bound to each other. Exemplary aliphatic hydrocarbon groups include linear or branched chain alkyl groups (e.g., alkyl groups each having 1 to 8 carbon atoms), such as methyl, ethyl, propyl, isopropyl, butyl, isobutyl, s-butyl, t-butyl, hexyl, and octyl groups; linear or branched chain alkenyl groups (e.g., alkenyl groups each having 2 to 8 carbon atoms), such as allyl group; and linear or branched chain alkynyl groups (e.g., alkynyl groups each having 2 to 8 carbon atoms), such as propynyl group. Exemplary alicyclic hydrocarbon groups include cycloalkyl groups (e.g., cycloalkyl groups each having 3 to 8 members), such as cyclopropyl, cyclopentyl, and cyclohexyl groups; cycloalkenyl groups (e.g., cycloalkenyl groups each having 3 to 8 members), such as cyclopentenyl and cyclohexenyl groups; and bridged carbocyclic groups (e.g., bridged carbocyclic groups each having 4 to 20 carbon atoms), such as adamantyl and norbornyl groups. Exemplary aromatic hydrocarbon groups include aromatic hydrocarbon groups each having 6 to 14 carbon atoms, such as phenyl and naphthyl groups. Exemplary groups each containing an aliphatic hydrocarbon group and an aromatic hydrocarbon group bound to each other include benzyl and 2-phenylethyl groups. Each of these hydrocarbon groups may have one or more substituents, and examples thereof include alkyl groups such as alkyl groups each having 1 to 4 carbon atoms; haloalkyl groups such as haloalkyl groups each having 1 to 4 carbon atoms; halogen atoms; protected or unprotected hydroxyl groups; protected or unprotected hydroxymethyl groups; protected or unprotected carboxyl groups; and oxo groups. Protecting groups for such substituents may be protecting groups customarily used in organic syntheses.

Examples of the heterocyclic group include heterocyclic groups each containing at least one heteroatom selected from the group consisting of oxygen atoms, sulfur atoms, and nitrogen atoms.

Preferred organic groups include alkyl groups each having 1 to 8 carbon atoms; and organic groups each containing a cyclic skeleton. Examples of a "ring" constituting the cyclic skeleton include monocyclic or polycyclic nonaromatic or aromatic carbon rings or heterocyclic rings. Among them, preferred are monocyclic or polycyclic nonaromatic carbon rings and lactone rings (to which one or more nonaromatic carbon rings may be fused). Exemplary monocyclic nonaromatic carbon rings include cycloalkane rings each having 3 to about 15 members, such as cyclopentane ring and cyclohexane ring.

Exemplary polycyclic nonaromatic carbon rings (bridged carbon rings) include adamantane ring; rings each containing a norbornane ring or norbornene ring, such as norbornane ring, norbornene ring, bornane ring, isobornane ring, tricyclo[5.2.1.0$^{2,6}$]decane ring, and tetracyclo[4.4.0.1$^{2,5}$.1$^{7,10}$]dodecane ring; rings corresponding to polycyclic aromatic fused rings, except for being hydrogenated (of which rings being fully hydrogenated are preferred), such as perhydroindene ring, decalin ring (perhydronaphthalene ring), perhydrofluorene ring (tricyclo[7.4.0.0$^{3,8}$]tridecane ring), and perhydroanthracene ring; and bicyclic, tricyclic, tetracyclic, or higher bridged carbon rings (e.g., bridged carbon rings each having about 6 to about 20 carbon atoms), such as tricyclo[4.2.2.1$^{2,5}$]undecane ring. Examples of the lactone rings include γ-butyrolactone ring, 4-oxatricyclo[4.3.1.1$^{3,8}$]undecan-5-one ring, 4-oxatricyclo[4.2.1.0$^{3,7}$]nonan-5-one ring, and 4-oxatricyclo[5.2.1.0$^{2,6}$]decan-5-one ring.

The ring constituting the cyclic skeleton may have one or more substituents. Exemplary substituents herein include alkyl groups (e.g., alkyl groups each having 1 to 4 carbon atoms), such as methyl group; haloalkyl group (e.g., haloalkyl groups each having 1 to 4 carbon atoms), such as trifluoromethyl group; halogen atoms such as chlorine atoms and fluorine atoms; protected or unprotected hydroxyl groups; protected or unprotected hydroxyalkyl groups; protected or unprotected mercapto groups; protected or unprotected carboxyl groups; protected or unprotected amino groups; and protected or unprotected sulfonic groups. Protecting groups for these substituents may be protecting groups customarily used in organic syntheses.

The ring constituting the cyclic skeleton may be bound to the oxygen atom in Formula (4d) (the oxygen atom at the adjacent position to $R^{10}$) directly or indirectly with the interposition of a linkage group. Exemplary linkage groups include linear or branched chain alkylene groups such as methylene, methylmethylene, dimethylmethylene, ethylene, propylene, and trimethylene groups; carbonyl group; oxygen atom (ether bond; —O—); oxycarbonyl group (ester bond; —COO—); aminocarbonyl group (amide bond; —CONH—); and groups each including two or more of them bound to each other.

At least two of $R^8$, $R^9$, and $R^{10}$ may be bound to each other to form a ring with an adjacent atom or atoms. Examples of the ring include cycloalkane rings such as cyclopropane ring, cyclopentane ring, and cyclohexane ring; oxygen-containing rings such as tetrahydrofuran ring, tetrahydropyran ring, and oxepane ring; and bridged rings.

There may be stereoisomers in each of the compounds represented by Formulae (4a), (4b), (4c), and (4d). Each of such stereoisomers may be used alone or in combination as a mixture.

Typical examples of the compounds represented by Formula (4a) include, but are not limited to, 2-(meth)acryloyloxy-2-methyladamantane, 1-hydroxy-2-(meth)acryloyloxy-2-methyladamantane, 5-hydroxy-2-(meth)acryloyloxy-2-methyladamantane, and 2-(meth)acryloyloxy-2-ethyladamantane.

Typical examples of the compounds represented by Formula (4b) include, but are not limited to, 1-(1-(meth)acryloyloxy-1-methylethyl)adamantane, 1-hydroxy-3-(1-(meth)acryloyloxy-1-methylethyl)adamantane, 1-(1-ethyl-1-(meth)acryloyloxypropyl)adamantane, and 1-(1-(meth)acryloyloxy-1-methylpropyl)adamantane.

Typical examples of the compounds represented by Formula (4c) include, but are not limited to, 1-t-butoxycarbonyl-3-(meth)acryloyloxyadamantane and 1-(2-tetrahydropyranyloxycarbonyl)-3-(meth)acryloyloxyadamantane.

Typical examples of the compounds represented by Formula (4d) include, but are not limited to, 1-adamantyloxy-1-ethyl(meth)acrylate, 1-adamantylmethyloxy-1-ethyl(meth)acrylate, 2-(1-adamantylethyl)oxy-1-ethyl(meth)acrylate, 1-bornyloxy-1-ethyl(meth)acrylate, 2-norbornyloxy-1-ethyl(meth)acrylate, 2-tetrahydropyranyl(meth)acrylate, and 2-tetrahydrofuranyl(meth)acrylate.

Each of the compounds represented by Formula (4d) may be prepared, for example, by reacting a corresponding vinyl ether compound with (meth)acrylic acid by the catalysis of an acid catalyst according to customary processes. For example, 1-adamantyloxy-1-ethyl(meth)acrylate may be prepared by reacting 1-adamantyl vinyl ether with (meth)acrylic acid in the presence of an acid catalyst.

The photoresist resin capable of being alkali-soluble by the action of an acid in the present invention may further have, as polymer units (constitutional repeating units), one or more other polymer units than the polymer units each having a group capable of being alkali-soluble by the action of an acid. Exemplary polymerizable unsaturated monomers corresponding to the other polymer units include monomers capable of imparting hydrophilicity and/or water solubility to the photoresist resin or improving these properties of the photoresist resin. Examples of such monomers include polar-group-containing monomers such as hydroxyl-containing monomers (including hydroxyl-protected compounds), mercapto-containing monomers (including mercapto-protected compounds), carboxyl-containing monomers (including carboxyl-protected compounds), amino-containing monomers (including amino-protected compounds), sulfonic-containing monomers (including sulfonic-protected compounds), monomers each containing a lactone skeleton, monomers each containing a cyclic ketone skeleton, monomers each containing an acid anhydride, and imido-containing monomers.

Of polymer units for constituting the resin capable of being alkali-soluble by the action of an acid, polymer units represented by Formula (2) are polymer units each containing a lactone skeleton. Exemplary monomers corresponding to the polymer units represented by Formula (2) are as follows. There may be stereoisomers in each of the compounds (monomers) represented by Formulae (5a), (5b), and (5c). Each of such stereoisomers may be used alone or in combination as a mixture.

[Chem. 5]

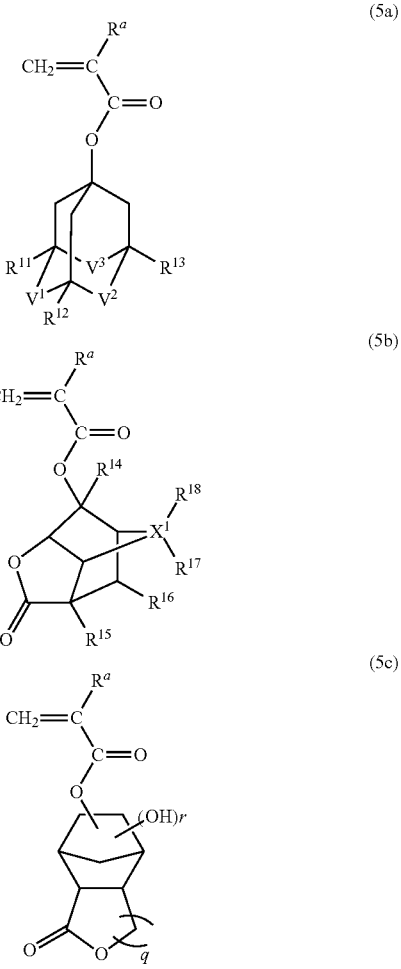

In the formulae, $R^a$ is as defined above; $R^{11}$, $R^{12}$, and $R^{13}$ are the same as or different from one another and each represent a hydrogen atom, an alkyl group, a protected or unprotected hydroxyl group, a protected or unprotected hydroxyalkyl group, or a protected or unprotected carboxyl group; $V^1$, $V^2$, and $V^3$ are the same as or different from one another and each represent —$CH_2$—, —CO— or —COO—, wherein (i) at least one of $V^1$, $V^2$, and $V^3$ is —CO— or —COO—, or (ii) at least one of $R^{11}$, $R^{12}$, and $R^{13}$ is a protected or unprotected hydroxyl group, a protected or unprotected hydroxyalkyl group, or a protected or unprotected carboxyl group; $X^1$ represents a carbon atom, an oxygen atom, or a sulfur atom, wherein the substituents $R^{17}$ and $R^{18}$ are present only when $X^1$ is a carbon atom; $R^{14}$, $R^{15}$, $R^{16}$, $R^{17}$, and $R^{18}$ are the same as or different from one another and each represent a hydrogen atom, an alkyl group, a protected or unprotected hydroxyl group, a protected or unprotected hydroxyalkyl group, a protected or unprotected carboxyl group, a cyano group, a halogen atom such as fluorine atom or chlorine atom, or a fluoroalkyl group having 1 to 6 carbon atoms; "q" denotes 1 or 2; and "r" denotes 0 or 1.

Typical examples of the compounds represented by Formula (5a) include, but are not limited to, 1-(meth)acryloyloxy-4-oxatricyclo[4.3.1.1³,⁸]undecan-5-one, 1-(meth)acryloyloxy-4,7-dioxatricyclo[4.4.1.1³,⁹]dodecane-5,8-dione, 1-(meth)acryloyloxy-4,8-dioxatricyclo[4.4.1.1³,⁹]dodecane-5,7-dione, 1-(meth)acryloyloxy-5,7-dioxatricyclo[4.4.1.1³,⁹]dodecane-4,8-dione, 1-(meth)acryloyloxy-3-hydroxyadamantane, 1-(meth)acryloyloxy-3,5-dihydroxyadamantane, 1-(meth)acryloyloxy-3,5,7-trihydroxyadamantane, 1-(meth)acryloyloxy-3-hydroxy-5,7-dimethyladamantane, and 1-(meth)acryloyloxy-3-carboxyadamantane.

Typical examples of the compounds represented by Formula (5b) include, but are not limited to, the following compounds. Typically, representative examples of the compounds represented by Formula (5b) in which $X^1$ is a carbon atom include 5-(meth)acryloyloxy-3-oxatricyclo[4.2.1.0⁴,⁸]nonan-2-one, 5-(meth)acryloyloxy-5-methyl-3-oxatricyclo[4.2.1.0⁴,⁸]nonan-2-one, 5-(meth)acryloyloxy-1-methyl-3-oxatricyclo[4.2.1.0⁴,⁸]nonan-2-one, 5-(meth)acryloyloxy-9-methyl-3-oxatricyclo[4.2.1.0⁴,⁸]nonan-2-one, 5-(meth)acryloyloxy-9-carboxy-3-oxatricyclo[4.2.1.0⁴,⁸]nonan-2-one, 5-(meth)acryloyloxy-9-methoxycarbonyl-3-oxatricyclo[4.2.1.0⁴,⁸]nonan-2-one, 5-(meth)acryloyloxy-9-ethoxycarbonyl-3-oxatricyclo[4.2.1.0⁴,⁸]nonan-2-one, and 5-(meth)acryloyloxy-9-t-butoxycarbonyl-3-oxatricyclo[4.2.1.0⁴,⁸]nonan-2-one.

The representative examples further include 1-cyano-5-(meth)acryloyloxy-3-oxatricyclo[4.2.1.0⁴,⁸]nonan-2-one, 1-fluoro-5-(meth)acryloyloxy-3-oxatricyclo[4.2.1.0⁴,⁸]nonan-2-one, 1-chloro-5-(meth)acryloyloxy-3-oxatricyclo[4.2.1.0⁴,⁸]nonan-2-one, 1-chloro-5-(meth)acryloyloxy-3-oxatricyclo[4.2.1.0⁴,⁸]nonan-2-one, 1-trifluoromethyl-5-(meth)acryloyloxy-3-oxatricyclo[4.2.1.0⁴,⁸]nonan-2-one, 9-cyano-5-(meth)acryloyloxy-3-oxatricyclo[4.2.1.0⁴,⁸]nonan-2-one, 9-fluoro-5-(meth)acryloyloxy-3-oxatricyclo[4.2.1.0⁴,⁸]nonan-2-one, 9-chloro-5-(meth)acryloyloxy-3-oxatricyclo[4.2.1.0⁴,⁸]nonan-2-one, 9-chloro-5-(meth)acryloyloxy-3-oxatricyclo[4.2.1.0⁴,⁸]nonan-2-one, and 9-trifluoromethyl-5-(meth)acryloyloxy-3-oxatricyclo[4.2.1.0⁴,⁸]nonan-2-one.

Typical examples of the compounds represented by Formula (5b) in which $X^1$ is an oxygen atom include 1-cyano-5-(meth)acryloyloxy-3,7-dioxatricyclo[4.2.1.0⁴,⁸]nonan-2-one, 1-fluoro-5-(meth)acryloyloxy-3,7-dioxatricyclo[4.2.1.0⁴,⁸]nonan-2-one, 1-chloro-5-(meth)acryloyloxy-3,7-dioxatricyclo[4.2.1.0⁴,⁸]nonan-2-one, 1-chloro-5-(meth)acryloyloxy-3,7-dioxatricyclo[4.2.1.0⁴,⁸]nonan-2-one, 1-trifluoromethyl-5-(meth)acryloyloxy-3,7-dioxatricyclo[4.2.1.0⁴,⁸]nonan-2-one, 9-cyano-5-(meth)acryloyloxy-3,7-dioxatricyclo[4.2.1.0⁴,⁸]nonan-2-one, 9-fluoro-5-(meth)acryloyloxy-3,7-dioxatricyclo[4.2.1.0⁴,⁸]nonan-2-one, 9-chloro-5-(meth)acryloyloxy-3,7-dioxatricyclo[4.2.1.0⁴,⁸]nonan-2-one, 9-chloro-5-(meth)acryloyloxy-3,7-dioxatricyclo[4.2.1.0⁴,⁸]nonan-2-one, and 9-trifluoromethyl-5-(meth)acryloyloxy-3,7-dioxatricyclo[4.2.1.0⁴,⁸]nonan-2-one.

Typical examples of the compounds represented by Formula (5c) include, but are not limited to, 8-(meth)acryloyloxy-4-oxatricyclo[5.2.1.0²,⁶]decan-5-one and 9-(meth)acryloyloxy-4-oxatricyclo[5.2.1.0²,⁶]decan-5-one.

Typical examples of monomers (polar-group-containing monomers) corresponding to polymer unite represented by Formula (3) include monomers represented by following Formula (6):

[Chem. 6]

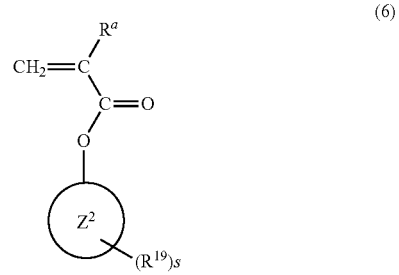

(6)

In Formula (6), Ring $Z^2$ represents an alicyclic hydrocarbon ring having 6 to 20 carbon atoms; $R^a$ is as defined above; $R^{19}$s are substituents bound to Ring $Z^2$, are the same as or different from each other, and each represent an oxo group, an alkyl group, a protected or unprotected hydroxyl group, a protected or unprotected hydroxyalkyl group, a protected or unprotected carboxyl group, a protected or unprotected amino group, or a protected or unprotected sulfonic group, wherein at least one of s$R^{19}$s is an oxo group, a protected or unprotected hydroxyl group, a protected or unprotected hydroxyalkyl group, a protected or unprotected carboxyl group, a protected or unprotected amino group, or a protected or unprotected sulfonic group; and "s" denotes an integer of 1 to 3.

The alicyclic hydrocarbon ring having 6 to 20 carbon atoms as Ring $Z^2$ may be a monocyclic ring or a polycyclic ring such as fused ring or bridged ring. Exemplary alicyclic hydrocarbon rings include cyclohexane ring, cyclooctane ring, cyclodecane ring, adamantane ring, norbornane ring, norbornene ring, bornane ring, isobornane ring, perhydroindene ring, decalin ring, perhydrofluorene ring (tricyclo[7.4.0.0$^{3,8}$]tridecane ring), perhydroanthracene ring, tricyclo[5.2.1.0$^{2,6}$]decane ring, tricyclo[4.2.2.1$^{2,5}$]undecane ring, and tetracyclo[4.4.0.1$^{2,5}$.1$^{7,10}$]dodecane ring. The alicyclic hydrocarbon ring may have one or more substituents. Exemplary substituents herein include alkyl groups (e.g., alkyl groups each having 1 to 4 carbon atoms) such as methyl group; haloalkyl groups such as trifluoromethyl group; halogen atoms such as fluorine atoms and chlorine atoms; protected or unprotected hydroxyl groups; protected or unprotected hydroxyalkyl groups; protected or unprotected mercapto groups; oxo groups; protected or unprotected carboxyl groups; protected or unprotected amino groups; and protected or unprotected sulfonic groups.

In Formula (6), exemplary alkyl groups as $R^{19}$ include linear or branched chain alkyl groups each having 1 to about 20 carbon atoms, such as methyl, ethyl, propyl, isopropyl, butyl, isobutyl, s-butyl, t-butyl, hexyl, octyl, decyl, and dodecyl groups. Exemplary protected or unprotected amino groups include amino group; and substituted amino groups including alkylamino groups each having 1 to 4 carbon atoms, such as methylamino, ethylamino, and propylamino groups. Exemplary protected or unprotected sulfonic groups include a —SO$_3$R$^e$ group. In this group, R$^e$ represents a hydrogen atom or an alkyl group, and exemplary alkyl groups include linear or branched chain alkyl groups each having 1 to 6 carbon atoms, such as methyl, ethyl, propyl, isopropyl, butyl, isobutyl, s-butyl, t-butyl, and hexyl groups. As $R^{19}$, the protected or unprotected hydroxyl group, the protected or unprotected hydroxyalkyl group, the protected or unprotected mercapto group, and the protected or unprotected carboxyl group are as described above.

Typical examples of the compounds represented by Formula (6) include, but are not limited to, 1-hydroxy-3-(meth)acryloyloxyadamantane, 1,3-dihydroxy-5-(meth)acryloyloxyadamantane, 1-carboxy-3-(meth)acryloyloxyadamantane, 1,3-dicarboxy-5-(meth)acryloyloxyadamantane, 1-carboxy-3-hydroxy-5-(meth)acryloyloxyadamantane, 1-t-butoxycarbonyl-3-(meth)acryloyloxyadamantane, 1,3-bis(t-butoxycarbonyl)-5-(meth)acryloyloxyadamantane, 1-t-butoxycarbonyl-3-hydroxy-5-(meth)acryloyloxyadamantane, 1-(2-tetrahydropyranyloxycarbonyl)-3-(meth)acryloyloxyadamantane, 1,3-bis(2-tetrahydropyranyloxycarbonyl)-5-(meth)acryloyloxyadamantane, 1-hydroxy-3-(2-tetrahydropyranyloxycarbonyl)-5-(meth)acryloyloxyadamantane, and 1-(meth)acryloyloxy-4-oxoadamantane.

Examples of the polar-group-containing monomers further include acrylic acid, methacrylic acid, maleic anhydride, and maleimide.

Where necessary, the resin capable of being alkali-soluble by the action of an acid may further include, as constitutive polymer units thereof, additional polymer units in addition to the polymer units represented by Formulae (1), (2), and (3). Specific examples of such additional polymer units include vinyl monomers including (meth)acrylic acid ester compounds each having a substituted or unsubstituted linear or branched chain alkyl group having 1 to 20 carbon atoms, such as methyl(meth)acrylate, ethyl(meth)acrylate, 2-ethylhexyl(meth)acrylate, n-butyl(meth)acrylate, n-hexyl(meth)acrylate, lauryl(meth)acrylate, and stearyl(meth)acrylate; (meth)acrylic acid ester compounds each having a substituted or unsubstituted alicyclic hydrocarbon group having 6 to 20 carbon atoms, such as cyclohexyl(meth)acrylate, norbornyl(meth)acrylate, adamantyl(meth)acrylate, and tetracyclododecyl(meth)acrylate; substituted or unsubstituted aromatic alkenyl compounds such as styrene, α-styrene, and p-methylstyrene; vinyl cyanide compounds such as acrylonitrile and methacrylonitrile; and (meth)acrylamide compounds such as N,N-dimethyl(meth)acrylamide and N-isopropyl(meth)acrylamide.

When working as polymer units (synonymous with monomer units) constituting the photoresist resin capable of being alkali-soluble by the action of an acid herein, the amount of polymer units represented by Formula (1) is, but is not limited to, generally about 1 to 100 percent by mole, preferably about 5 to 80 percent by mole, and more preferably about 10 to 60 percent by mole, based on the total amount of monomer units constituting the polymer (resin). Likewise, the amount of polymer units represented by Formula (2) each having a lactone skeleton is typically about 0 to 95 percent by mole, preferably about 10 to 90 percent by mole, and more preferably about 20 to 60 percent by mole. The amount of polymer units represented by Formula (3) is typically about 0 to 70 percent by mole, preferably about 5 to 60 percent by mole, and more preferably about 10 to 50 percent by mole. The phenomenon "capable of being alkali-soluble by the action of an acid", to be more specific, refers to a phenomenon that protecting groups in the resin leave by the action of an acid generated typically from a light-activatable acid generator and by heating according to necessity, and the resulting resin develops a property of being soluble typically in an alkaline developer.

The present invention has been made based on the finding that a resin solution for photoresists which is very stable and homogeneous may be obtained by a production method including the steps of heating and thereby aging a solution at 30° C. to 90° C. for 30 minutes or longer, the solution containing, in a solvent, a photoresist resin capable of being alkali-soluble by the action of an acid; and filtering the aged solution through a filter medium having a pore size of 1 µm or less. The heating/aging temperature is generally 30° C. to 90° C., preferably about 35° C. to 80° C., and particularly preferably about 40° C. to 70° C. Aging, if performed at a heating temperature of lower than 30° C., takes a very long time, thus being uneconomical. Aging, if performed at a heating temperature of higher than 90° C., causes the photoresist resin to decompose, thus being undesirable.

The time for heating and aging the solution containing the photoresist resin capable of being alkali-soluble by the action of an acid is generally 30 minutes or longer, preferably 2 hours or longer, and particularly preferably 4 hours or longer. Heating and aging, if performed for a duration shorter than 30 minutes, may cause the resin solution to have insufficient stability in long-term storage. The upper limit of the heating and aging time is not critical. Specifically, the advantageous effects of the present invention may be exhibited even when the resin solution is stored at a suitable temperature over a long period of time and then filtrated.

The filter medium for use in filtration herein has a pore size of generally 1 µm or less, preferably 0.5 µm or less, and particularly preferably 0.1 µm or less. A filter medium, if having a pore size of more than 1 µm, fails to sufficiently remove particles from the resin solution. Regarding the filter medium, the pore size is important, and its material is not limited. Exemplary materials for the filter medium include polytetrafluoroethylenes (PTFEs), polyethylenes, polypropylenes, and nylons.

The resin solution upon heating and aging herein has a resin concentration of generally 3 to 40 percent by weight, preferably about 3 to 30 percent by weight, and particularly preferably about 3 to 20 percent by weight. The resin solution, if having a resin concentration of less than 3 percent by weight, may be treated in a large amount, thus being uneconomical. The resin solution, if having a resin concentration of more than 40 percent by weight, may show large resistance to filtration and may thereby be not filtrated satisfactorily.

The solvent for use in the present invention in heating and aging of the resin solution for photoresists is not limited, as long as being a solvent that dissolves the resin therein, but is preferably one or more solvents for use in the resist composition, such as glycol solvents, ester solvents, ketone solvents, and mixtures of these solvents. Among them, preferred are propylene glycol monomethyl ether (PGME), propylene glycol monomethyl ether acetate (PGMEA), ethyl lactate, methyl isobutyl ketone, methyl amyl ketone, cyclohexanone, and mixtures of these solvents (e.g., solvents each containing at least propylene glycol monomethyl ether acetate and/or propylene glycol monomethyl ether); of which particularly preferred are solvents each containing at least propylene glycol monomethyl ether acetate, such as propylene glycol monomethyl ether acetate (as a single solvent); a solvent mixture containing propylene glycol monomethyl ether acetate and propylene glycol monomethyl ether; a solvent mixture containing propylene glycol monomethyl ether acetate and ethyl lactate; and a solvent mixture containing propylene glycol monomethyl ether acetate and cyclohexanone.

The polymer compound (photoresist resin capable of being alkali-soluble by the action of an acid) for use herein may be prepared through any polymerization form, but is preferably prepared through radical polymerization. Polymerization of a mixture of monomers may be carried out by a technique customarily used in the preparation typically of acrylic polymers, such as solution polymerization, bulk polymerization, suspension polymerization, bulk-suspension polymerization, or emulsion polymerization. Among them, solution polymerization techniques are preferred, of which dropping polymerization is more preferred. Specifically, the drop polymerization may be performed, for example, by any of the following processes (i), (ii), and (iii). In the process (i), a solution of monomers in an organic solvent, and a solution of a polymerization initiator in the organic solvent are previously prepared respectively, and these solutions are each added dropwise to the organic solvent held to a constant temperature. In the process (ii), a mixed solution containing monomers and a polymerization initiator in an organic solvent is prepared and added dropwise to the organic solvent held to a constant temperature. In the process (iii), a solution of monomers in an organic solvent, and a solution of a polymerization initiator in the organic solvent are prepared respectively, and the solution of polymerization initiator is added dropwise to the solution of monomers held to a constant temperature.

When radical polymerization is adopted, exemplary radical polymerization initiators include, but are not limited to, azo compounds, peroxide compounds, and redox compounds. Among them, preferred examples include dimethyl 2,2'-azobisisobutyrate, azobisisobutyronitrile, 2,2'-azobis(2-methylbutyronitrile), t-butyl peroxypivalate, di-t-butyl peroxide, iso-butyryl peroxide, lauroyl peroxide, succinyl peroxide, dicinnamyl peroxide, di-n-propyl peroxydicarbonate, t-butylperoxy allyl monocarbonate, benzoyl peroxide, hydrogen peroxide, and ammonium persulfate.

Any of known solvents can be used as the polymerization solvent, and examples thereof include ethers including chain ethers (e.g., diethyl ether, and glycol ethers such as propylene glycol monomethyl ether) and cyclic ethers (e.g., tetrahydrofuran and dioxane); esters such as methyl acetate, ethyl acetate, butyl acetate, ethyl lactate, and glycol ether esters (e.g., propylene glycol monomethyl ether acetate); ketones such as acetone, methyl ethyl ketone, methyl isobutyl ketone, and cyclohexanone; amides such as N,N-dimethylacetamide and N,N-dimethylformamide; sulfoxides such as dimethyl sulfoxide; alcohols such as methanol, ethanol, and propanol; hydrocarbon including aromatic hydrocarbons (e.g., benzene, toluene, and xylenes), aliphatic hydrocarbons (e.g., hexane), and alicyclic hydrocarbons (e.g., cyclohexane); and mixtures of these solvents. The polymerization temperature may be chosen within the range typically of about 30° C. to 150° C.

A polymer (resin) prepared through polymerization may be purified through precipitation or reprecipitation. A solvent for use in precipitation or reprecipitation may be either an organic solvent or water and may also be a solvent mixture. Exemplary organic solvents for use as the precipitation or reprecipitation solvent include hydrocarbons including aliphatic hydrocarbons (e.g., pentane, hexane, heptane, and octane), alicyclic hydrocarbons (e.g., cyclohexane and methylcyclohexane), and aromatic hydrocarbons (e.g., benzene, toluene, and xylenes); halogenated hydrocarbons such as halogenated aliphatic hydrocarbons (e.g., methylene chloride, chloroform, and carbon tetrachloride) and halogenated aromatic hydrocarbons (e.g., chlorobenzene and dichlorobenzenes); nitro compounds such as nitromethane and nitroethane; nitriles such as acetonitrile and benzonitrile; ethers such as chain ethers (e.g., diethyl ether, diisopropyl ether, and dimethoxyethane) and cyclic ethers (e.g., tetrahydrofuran and dioxane); ketones such as acetone, methyl ethyl ketone, and diisobutyl ketone; esters such as ethyl acetate and butyl acetate; carbonates such as dimethyl carbonate, diethyl carbonate, ethylene carbonate, and propylene carbonate;

alcohols such as methanol, ethanol, propanol, isopropyl alcohol, and butanol; carboxylic acids such as acetic acid; and solvent mixtures containing these solvents.

Of organic solvents for use as the precipitation or reprecipitation solvent, solvents each containing at least a hydrocarbon are preferred, of which solvents each containing at least an aliphatic hydrocarbon such as hexane are more preferred. The ratio of the hydrocarbon (e.g., an aliphatic hydrocarbon such as hexane) to another solvent [(the former)/(the latter)] in the solvent containing at least the hydrocarbon is typically about 10/90 to 99/1, preferably about 30/70 to 98/2, and more preferably about 50/50 to 97/3, in terms of volume ratio at 25° C.

The polymer compound (resin) has a weight-average molecular weight (Mw) of typically about 1000 to 500000 and preferably about 3000 to 50000 and has a molecular weight distribution (Mw/Mn) of typically about 1.2 to 2.5. The symbol Mn indicates a number-average molecular weight, and both Mn and Mw are molecular weights in terms of a polystyrene.

The polymer compound is usable as a highly functional polymer in various fields, because it is highly stable and resistant typically to chemicals, is satisfactorily soluble in an organic solvent, is highly hydrolyzable, and a hydrolyzed product thereof is satisfactorily soluble in water.

In a preferred embodiment according to the present invention, the method for producing a resin solution for photoresists further includes the steps of carrying out a polymerization reaction in the above manner to give a polymerization solution containing the photoresist resin; adding the polymerization solution to a poor solvent with respect to the photoresist resin to form precipitates; collecting the precipitates through filtration; dissolving the collected precipitates in an organic solvent to give a solution; and distilling off the poor solvent from the solution, before the step of heating and thereby aging the solution at 30° C. to 90° C. for 30 minutes or longer, the solution containing the photoresist resin capable of being alkali-soluble by the action of an acid.

The photoresist composition according to the present invention includes a photoresist resin (polymer compound) prepared typically by the method, a light-activatable acid generator, and a resist solvent. The photoresist composition may be prepared typically by adding a light-activatable acid generator to the resin solution for photoresists which has been obtained in the above manner.

Examples of the light-activatable acid generator include customary or known compounds that efficiently generate an acid upon irradiation with light (upon exposure), including diazonium salts; iodonium salts such as diphenyliodo hexafluorophosphate; sulfonium salts such as triphenylsulfonium hexafluoroantimonate, triphenylsulfonium hexafluorophosphate, and triphenylsulfonium methanesulfonate; sulfonic acid esters such as 1-phenyl-1-(4-methylphenyl) sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane; oxathiazole derivatives; s-triazine derivatives; disulfone derivatives such as diphenyldisulfone; imide compounds; oxime sulfonates; diazonaphthoquinone; and benzoin tosylate. Each of such light-activatable acid generators may be used alone or in combination.

The amount of light-activatable acid generators may be chosen as appropriate according typically to the strength of an acid generated upon the irradiation with light and the contents of respective constitutional repeating units in the polymer (photoresist resin). Typically, the amount may be chosen within the ranges of typically about 0.1 to 30 parts by weight, preferably about 1 to 25 parts by weight, and more preferably about 2 to 20 parts by weight, per 100 parts by weight of the polymer.

Exemplary resist solvents include the glycol solvents, ester solvents, ketone solvents, and mixtures of these solvents, exemplified above as the polymerization solvent. Among them, preferred are propylene glycol monomethyl ether, propylene glycol monomethyl ether acetate, ethyl lactate, methyl isobutyl ketone, methyl amyl ketone, cyclohexanone, and mixtures of them, of which particularly preferred are solvents each containing at least propylene glycol monomethyl ether acetate, such as propylene glycol monomethyl ether acetate (as a single solvent); a solvent mixture containing propylene glycol monomethyl ether acetate and propylene glycol monomethyl ether; a solvent mixture containing propylene glycol monomethyl ether acetate and ethyl lactate; and a solvent mixture containing propylene glycol monomethyl ether acetate and cyclohexanone.

The photoresist composition has a polymer concentration of typically about 3 to 40 percent by weight. The photoresist composition may further contain any of alkali-soluble components including alkali-soluble resins such as novolak resins, phenol resins, imide resins, and carboxyl-containing resins; and colorants such as dyestuffs.

The photoresist composition thus obtained is usable for highly accurate fine patterning (formation of a fine pattern), by applying the photoresist composition to a base or substrate, drying the applied film, applying light to the applied film (resist film) through a predetermined mask (or further performing post-exposure bake) to form a latent image pattern, and subsequently developing the latent image pattern.

Exemplary materials for the base or substrate include silicon wafers, metals, plastics, glass, and ceramics. The application of the photoresist composition may be performed with a customary coating device such as spin coater, dip coater, or roller coater. The resist film as coated film has a thickness of typically about 0.05 to 20 μm and preferably about 0.1 to 2 μm.

The light application (exposure) may be performed using rays with various wavelengths, such as ultraviolet rays and X-rays. For semiconductor resists, g line, i line, and excimer laser beams (e.g., XeCl, KrF, KrCl, ArF, or ArCl laser beams) may be used. The exposure energy is typically about 1 to 1000 $mJ/cm^2$ and preferably about 10 to 500 $mJ/cm^2$.

The light application allows the light-activatable acid generator to generate an acid. This acid acts, for example, on a protecting group (leaving group) to leave immediately and to form a group, such as carboxyl group, that helps the photoresist resin to be soluble in an alkali, which protecting group is typically for carboxyl group of a constitutional repeating unit capable of being soluble in an alkali by the action of the acid (constitutional repeating unit having an acid-leaving group) of the photoresist resin. Thus, the subsequent development with water or an alkaline developer (alkali dissolution) gives a predetermined pattern highly accurately.

EXAMPLES

The present invention will be illustrated in further detail with reference to several working examples below. It should be noted, however, that these examples are never construed to limit the scope of the present invention. The weight-average molecular weights (Mw) and the number-average molecular weights (Mn) of sample polymers are values in terms of standard polystyrene as determined through gel permeation chromatography (GPC) using a refractive index detector (RI)

and tetrahydrofuran solvent. The gel permeation chromatography was carried out using three columns "KF-806L" (supplied by Showa Denko K.K.) connected in series under conditions of a column temperature of 40° C., an RI temperature of 40° C., and a tetrahydrofuran flow rate of 0.8 ml/min.

Example 1

Synthesis of Following Polymer Compound

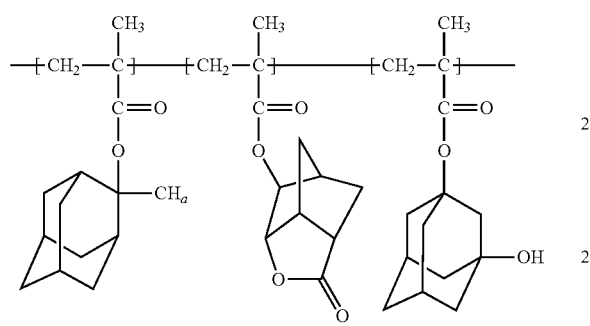

[Chem. 7]

In a nitrogen atmosphere, 35.7 g of propylene glycol monomethyl ether acetate (PGMEA) and 23.8 g of propylene glycol monomethyl ether (PGME) were placed in a round-bottomed flask equipped with a reflux condenser, a stirring bar, a three-way stop-cock, and a thermometer, to give a mixture; and a monomer solution was added dropwise to the mixture at a constant rate over 6 hours while stirring the mixture and holding the temperature to 80° C. The monomer solution contained 12.23 g of 2-methyl-2-methacryloyloxy-adamantane, 11.60 g of 5-methacryloyloxy-3-oxatricyclo[4.2.1.0$^{4,8}$]nonan-2-one, 6.17 g of 1-hydroxy-3-methacryloyloxyadamantane, 1.80 g of dimethyl 2,2'-azobisisobutyrate [trade name "V-601" supplied by Wako Pure Chemical Industries, Ltd.], 66.3 g of PGMEA, and 44.2 g of PGME. After the completion of dropwise addition, the stirring was continued for further 2 hours. After the completion of polymerization reaction, the resulting reaction solution was filtrated through a filter having a pore size of 0.1 μm, and the filtrate was added dropwise to a stirred 9:1 (by volume; 25° C.) mixture of hexane and ethyl acetate in an amount of 7 times the amount of the reaction solution, to give precipitates. The precipitates were collected by filtration, the resulting wet crystals were combined with propylene glycol monomethyl ether acetate (PGMEA) so as to have a solids content of 15 percent by weight, stirred, and dissolved therein to give a solution. The solution was concentrated at a pressure of 20 torr (=2.67 Pa). At the time point when the solids content reached about 40 percent by weight, the concentration was stopped, and the concentrated solution was diluted with PGMEA and PGME and thereby yielded a solution of a polymer in a concentration of 10 percent by weight in 6:4 (by weight) mixture of PGMEA and PGME. The solution was heated at 60° C. for 8 hours, air-cooled to 25° C., filtrated through a filter having a pore size of 0.1 μm, and thereby yielded a polymer solution. The resulting polymer was analyzed through GPC and found to have a weight-average molecular weight (Mw) of 8900 and a molecular weight distribution (Mw/Mn) of 1.90.

Example 2

Synthesis of Following Polymer Compound

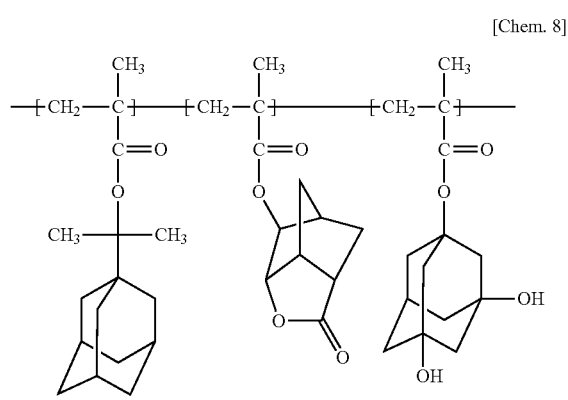 [SMILES: CCC(C)(CC(C)(CC(C)(C)C(=O)OC12CC3CC(O)(CC(O)(C3)C1)C2)C(=O)OC1C2CC3C(=O)OC1C3C2)C(=O)OC(C)(C)C12CC3CC(CC(C3)C1)C2]

[Chem. 8]

A polymer solution was prepared by the procedure of Example 1, except for using 12.89 g of 1-(1-methacryloyloxy-1-methylethyl)adamantane, 10.92 g of 5-methacryloyloxy-3-oxatricyclo[4.2.1.0$^{4,8}$]nonan-2-one, and 6.20 g of 1,3-dihydroxy-5-methacryloyloxyadamantane, instead of the three monomers used in Example 1. The resulting polymer was analyzed through GPC and found to have a weight-average molecular weight (Mw) of 8500 and a molecular weight distribution (Mw/Mn) of 1.87.

Example 3

Synthesis of Following Polymer Compound

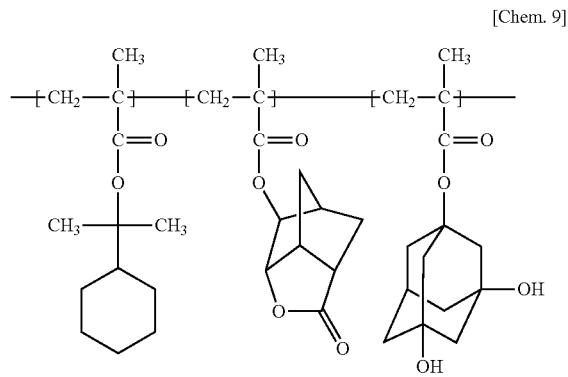 [SMILES: CCC(C)(CC(C)(CC(C)(C)C(=O)OC12CC3CC(O)(CC(O)(C3)C1)C2)C(=O)OC1C2CC3C(=O)OC1C3C2)C(=O)OC(C)(C)C1CCCCC1]

[Chem. 9]

A polymer solution was prepared by the procedure of Example 1, except for using 11.29 g of 1-(1-methacryloyloxy-1-methylethyl)cyclohexane, 11.94 g of 5-methacryloyloxy-3-oxatricyclo[4.2.1.0$^{4,8}$]nonan-2-one, and 6.77 g of 1,3-dihydroxy-5-methacryloyloxyadamantane, instead of the three monomers used in Example 1. The resulting polymer was analyzed through GPC and found to have a weight-average molecular weight (Mw) of 9100 and a molecular weight distribution (Mw/Mn) of 1.95.

Example 4

Synthesis of Following Polymer Compound

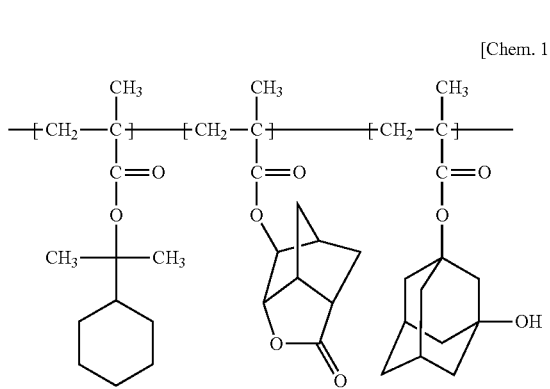

[Chem. 10]

A polymer solution was prepared by the procedure of Example 1, except for using 11.45 g of 1-(1-methacryloyloxy-1-methylethyl)cyclohexane, 12.11 g of 5-methacryloyloxy-3-oxatricyclo[4.2.1.0$^{4,8}$]nonan-2-one, and 6.44 g of 1-hydroxy-3-methacryloyloxyadamantane, instead of the three monomers used in Example 1. The resulting polymer was analyzed through GPC and found to have a weight-average molecular weight (Mw) of 9400 and a molecular weight distribution (Mw/Mn) of 1.98.

Example 5

Synthesis of Following Polymer Compound

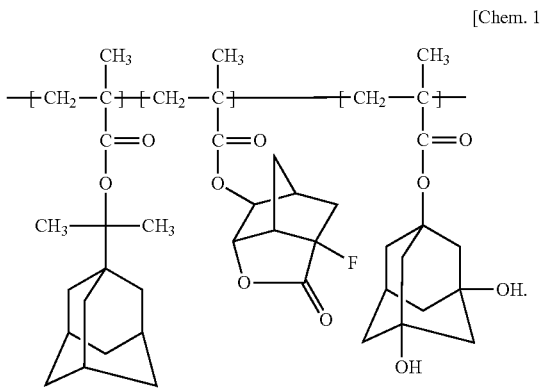

[Chem. 11]

A polymer solution was prepared by the procedure of Example 1, except for using 12.52 g of 1-(1-methacryloyloxy-1-methylethyl)adamantane, 11.46 g of 1-fluoro-5-methacryloyloxy-3-oxatricyclo[4.2.1.0$^{4,8}$]nonan-2-one, and 6.02 g of 1,3-dihydroxy-5-methacryloyloxyadamantane, instead of the three monomers used in Example 1. The resulting polymer was analyzed through GPC and found to have a weight-average molecular weight (Mw) of 8300 and a molecular weight distribution (Mw/Mn) of 1.83.

Example 6

Synthesis of Following Polymer Compound

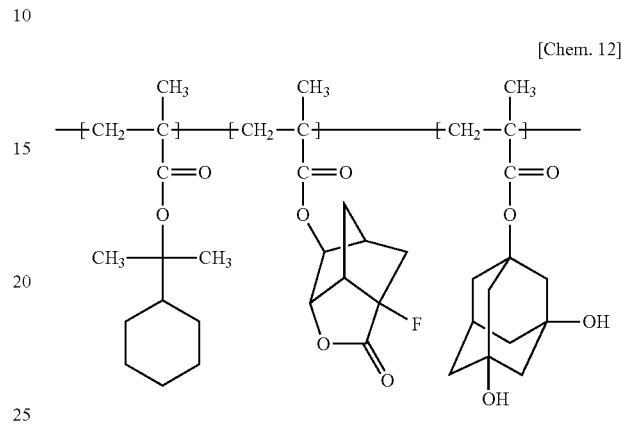

[Chem. 12]

A polymer solution was prepared by the procedure of Example 1, except for using 10.94 g of 1-(1-methacryloyloxy-1-methylethyl)cyclohexane, 12.50 g of 1-fluoro-5-methacryloyloxy-3-oxatricyclo[4.2.1.0$^{4,8}$]nonan-2-one, and 6.56 g of 1,3-dihydroxy-5-methacryloyloxyadamantane, instead of the three monomers used in Example 1. The resulting polymer was analyzed through GPC and found to have a weight-average molecular weight (Mw) of 8800 and a molecular weight distribution (Mw/Mn) of 1.85.

Example 7

Synthesis of Following Polymer Compound

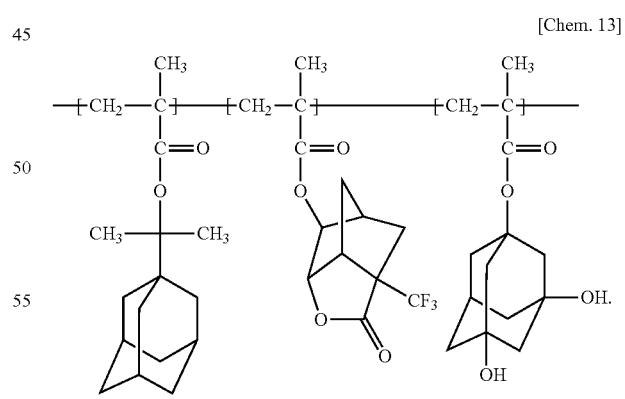

[Chem. 13]

A polymer solution was prepared by the procedure of Example 1, except for using 11.59 g of 1-(1-methacryloyloxy-1-methylethyl)adamantane, 12.83 g of 1-trifluoromethyl-5-methacryloyloxy-3-oxatricyclo[4.2.1.0$^{4,8}$]nonan-2-one, and 5.58 g of 1,3-dihydroxy-5-methacryloyloxyadamantane, instead of the three monomers used in Example 1. The resulting polymer was analyzed through GPC and found to have a weight-average molecular weight (Mw) of 7800 and a molecular weight distribution (Mw/Mn) of 1.79.

Example 8

Synthesis of Following Polymer Compound

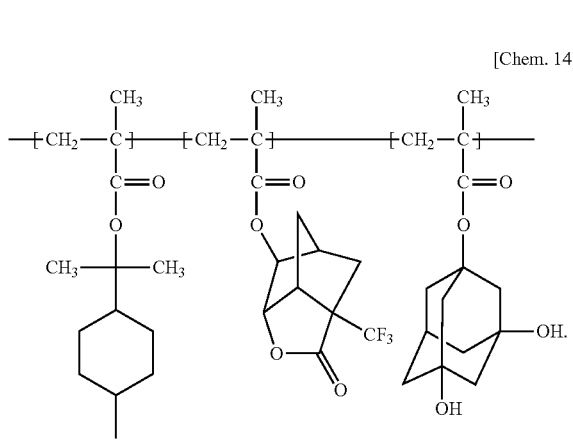 [SMILES: CCC(C)(CC(C)(CC(C)(C)C(=O)OC12CC3CC(O)(CC(O)(C3)C1)C2)C(=O)OC1C2CC3C1OC(=O)C3(C(F)(F)F)C2)C(=O)OC(C)(C)C1CCC(C)CC1]

[Chem. 14]

A polymer solution was prepared by the procedure of Example 1, except for using 10.50 g of 1-(1-methacryloyloxy-1-methylethyl)-3-methylcyclohexane, 13.59 g of 1-trifluoromethyl-5-methacryloyloxy-3-oxatricyclo[4.2.1.0$^{4,8}$]nonan-2-one, and 5.91 g of 1,3-dihydroxy-5-methacryloyloxyadamantane, instead of the three monomers used in Example 1. The resulting polymer was analyzed through GPC and found to have a weight-average molecular weight (Mw) of 8000 and a molecular weight distribution (Mw/Mn) of 1.81.

Example 9

Synthesis of Following Polymer Compound

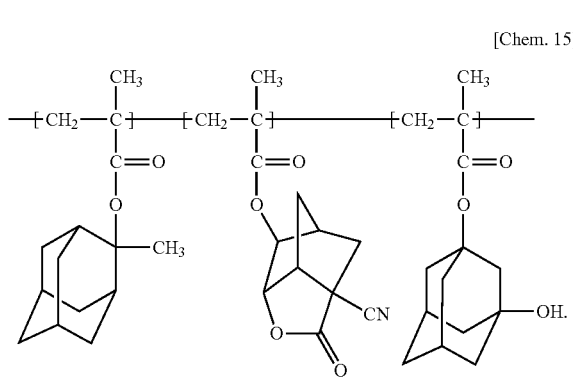

[Chem. 15]

A polymer solution was prepared by the procedure of Example 1, except for using 11.72 g of 2-methyl-2-methacryloyloxyadamantane, 12.37 g of 1-cyano-5-methacryloyloxy-3-oxatricyclo[4.2.1.0$^{4,8}$]nonan-2-one, and 5.91 g of 1-hydroxy-3-methacryloyloxyadamantane, instead of the three monomers used in Example 1. The resulting polymer was analyzed through GPC and found to have a weight-average molecular weight (Mw) of 8700 and a molecular weight distribution (Mw/Mn) of 1.82.

Example 10

Synthesis of Following Polymer Compound

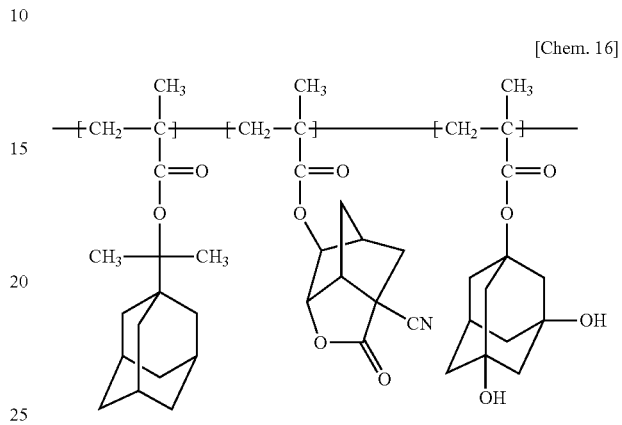

[Chem. 16]

A polymer solution was prepared by the procedure of Example 1, except for using 12.38 g of 1-(1-methacryloyloxy-1-methylethyl)adamantane, 11.67 g of 1-cyano-5-methacryloyloxy-3-oxatricyclo[4.2.1.0$^{4,8}$]nonan-2-one, and 5.95 g of 1,3-dihydroxy-5-methacryloyloxyadamantane, instead of the three monomers used in Example 1. The resulting polymer was analyzed through GPC and found to have a weight-average molecular weight (Mw) of 8100 and a molecular weight distribution (Mw/Mn) of 1.80.

Example 11

Synthesis of Following Polymer Compound

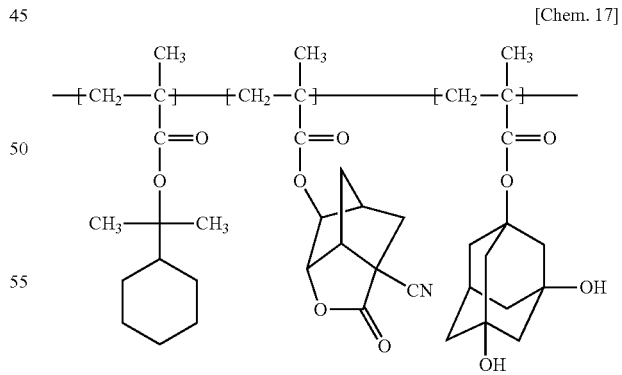

[Chem. 17]

A polymer solution was prepared by the procedure of Example 1, except for using 10.81 g of 1-(1-methacryloyloxy-1-methylethyl)cyclohexane, 12.71 g of 1-cyano-5-methacryloyloxy-3-oxatricyclo[4.2.1.0$^{4,8}$]nonan-2-one, and 6.48 g of 1,3-dihydroxy-5-methacryloyloxyadamantane, instead of the three monomers used in Example 1. The resulting polymer was analyzed through GPC and found to have a weight-average molecular weight (Mw) of 8900 and a molecular weight distribution (Mw/Mn) of 1.88.

Example 12

Synthesis of Following Polymer Compound

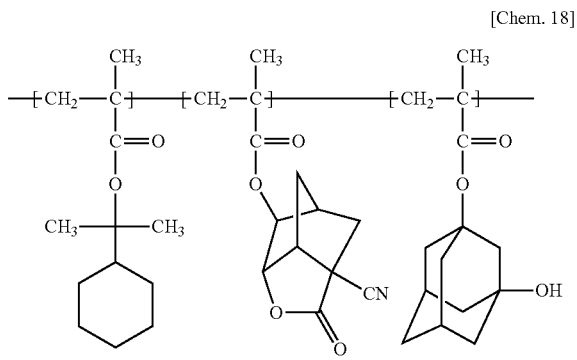 [SMILES: CCC(C)(CC(C)(CC(C)(C)C(=O)OC12CC3CC(CC(O)(C3)C1)C2)C(=O)OC1C2CC3C1OC(=O)C3(C#N)C2)C(=O)OC(C)(C)C1CCCCC1]

[Chem. 18]

A polymer solution was prepared by the procedure of Example 1, except for using 10.96 g of 1-(1-methacryloyloxy-1-methylethyl)cyclohexane, 12.89 g of 1-cyano-5-methacryloyloxy-3-oxatricyclo[4.2.1.0$^{4,8}$]nonan-2-one, and 6.16 g of 1-hydroxy-3-methacryloyloxyadamantane, instead of the three monomers used in Example 1. The resulting polymer was analyzed through GPC and found to have a weight-average molecular weight (Mw) of 9100 and a molecular weight distribution (Mw/Mn) of 1.91.

Example 13

Synthesis of Following Polymer Compound

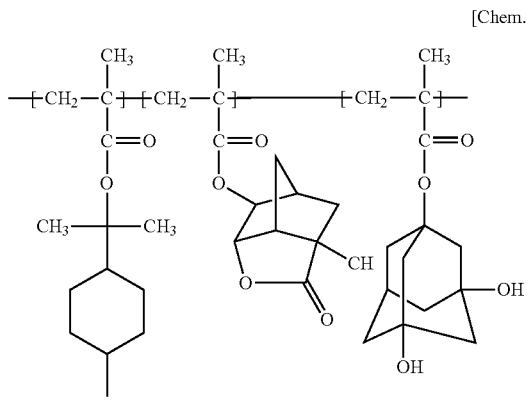

[Chem. 19]

A polymer solution was prepared by the procedure of Example 1, except for using 11.26 g of 1-(1-methacryloyloxy-1-methylethyl)-3-methylcyclohexane, 12.41 g of 1-cyano-5-methacryloyloxy-3-oxatricyclo[4.2.1.0$^{4,8}$]nonan-2-one, and 6.33 g of 1,3-dihydroxy-5-methacryloyloxyadamantane, instead of the three monomers used in Example 1. The resulting polymer was analyzed through GPC and found to have a weight-average molecular weight (Mw) of 8800 and a molecular weight distribution (Mw/Mn) of 1.88.

Comparative Examples 1 to 13

In Comparative Examples 1 to 13 corresponding to Examples 1 to 13, respectively, the procedure of the corresponding example was carried out, except for not performing the heating treatment at 60° C. for 8 hours.

Filterability Evaluation Test

Each of the polymer solutions obtained in the examples and comparative examples was adjusted to have a solids concentration of 5 percent by weight and a solvent composition of PGMEA:PGME of 6:4 (by weight) and left stand at 25° C. for one day and for ten days. The adjusted and stored polymer solutions (each 50 g) were placed in a stainless steel holder (KST-47 supplied by Advantech Toyo Kaisha, Ltd.) attached with a filter having a pore size of 0.02 μm, filtrated at a pressure of 0.15 MPa, and the filtration performance (filterability) of these polymer solutions was evaluated.

The evaluated filterability is shown in Table 1. A sample polymer solution which could be filtrated without clogging was evaluated as having good filterability (Good), and a sample polymer solution which failed to be filtrated due to clogging during the filtration operation was evaluated as having poor filterability.

TABLE 1

| | 1 day later | 10 days later | | 1 day later | 10 days later |
|---|---|---|---|---|---|
| Example 1 | Good | Good | Comparative Example 1 | Good | Poor |
| Example 2 | Good | Good | Comparative Example 2 | Poor | — |
| Example 3 | Good | Good | Comparative Example 3 | Good | Poor |
| Example 4 | Good | Good | Comparative Example 4 | Good | Poor |
| Example 5 | Good | Good | Comparative Example 5 | Poor | — |
| Example 6 | Good | Good | Comparative Example 6 | Poor | — |
| Example 7 | Good | Good | Comparative Example 7 | Poor | — |
| Example 8 | Good | Good | Comparative Example 8 | Good | Poor |
| Example 9 | Good | Good | Comparative Example 9 | Poor | — |
| Example 10 | Good | Good | Comparative Example 10 | Poor | — |
| Example 11 | Good | Good | Comparative Example 11 | Good | Poor |
| Example 12 | Good | Good | Comparative Example 12 | Good | Poor |
| Example 13 | Good | Good | Comparative Example 13 | Poor | — |

INDUSTRIAL APPLICABILITY

The present invention provides photoresist compositions which have such good filterability as to enable uniform patterning. The present invention further provides resin solutions for photoresists which are stable over a long time, namely, resin solutions for photoresists which can maintain their good filtration performance even after long-term storage.

The invention claimed is:
1. A method for producing a resin solution for photoresists, the method comprising the steps of heating and thereby aging a solution at 30° C. to 90° C. for 30 minutes or longer, the solution containing, in a solvent, a photoresist resin capable of being alkali-soluble by the action of an acid; and filtering the aged solution through a filter medium having a pore size of 1 μm or less, wherein, in the step of heating and thereby aging the solution at 30° C. to 90° C. for 30 minutes or longer, the solution containing the photoresist resin capable of being alkali-soluble by the action of an acid has a solids concentration of 3 to 40 percent by weight.

2. The method for producing a resin solution for photoresists, according to claim 1, wherein the photoresist resin capable of being alkali-soluble by the action of an acid comprises, as polymer units, at least a unit represented by following Formula (1):

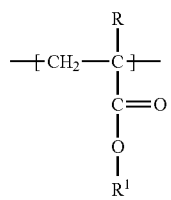

(1)

wherein R represents a hydrogen atom, a halogen atom, or an alkyl or haloalkyl group having 1 to 6 carbon atoms; and $R^1$ represents a protecting group capable of leaving with an acid.

3. The method for producing a resin solution for photoresists, according to claim 1, wherein the photoresist resin capable of being alkali-soluble by the action of an acid comprises, as polymer units, at least a unit represented by following Formula (2):

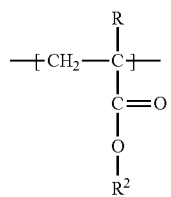

(2)

wherein R represents a hydrogen atom, a halogen atom, or an alkyl or haloalkyl group having 1 to 6 carbon atoms; and $R^2$ represents a group containing a lactone skeleton and having 4 to 20 carbon atoms.

4. The method for producing a resin solution for photoresists, according to claim 1, wherein the photoresist resin capable of being alkali-soluble by the action of an acid comprises, as polymer units, at least a unit represented by following Formula (3):

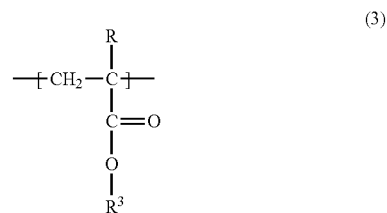

wherein R represents a hydrogen atom, a halogen atom, or an alkyl or haloalkyl group having 1 to 6 carbon atoms; and $R^3$ represents a group including a polar-group-containing alicyclic skeleton and having 4 to 20 carbon atoms.

5. The method for producing a resin solution for photoresists, according to claim 1, further comprising the steps of carrying out a polymerization reaction to give a polymerization solution containing the photoresist resin; adding the polymerization solution to a poor solvent with respect to the photoresist resin to form precipitates; collecting the precipitates through filtration; dissolving the collected precipitates in an organic solvent to give a solution; and distilling off residual poor solvent from the solution, before the step of heating and thereby aging the solution at 30° C. to 90° C. for 30 minutes or longer, the solution containing the photoresist resin capable of being alkali-soluble by the action of an acid.

6. The method for producing a resin solution for photoresists, according to claim 1, wherein the solvent used in the solution containing the photoresist resin capable of being alkali-soluble by the action of an acid comprises at least propylene glycol monomethyl ether acetate (PGMEA) and/or propylene glycol monomethyl ether (PGME).

\* \* \* \* \*